United States Patent
Zhang et al.

(10) Patent No.: US 9,064,819 B2
(45) Date of Patent: Jun. 23, 2015

(54) POST-ETCH TREATING METHOD (75) Inventors: Haiyang Zhang, Beijing (CN); Minda Hu, Beijing (CN); Junqing Zhou, Beijing (CN); Dongjiang Wang, Beijing (CN)

(73) Assignee: Semiconductor Manufacturing Internation (Beijing) Corporation, Beijing (CN)

( * ) Notice: Subject to any disclaimer, the term of this patent is extended or adjusted under 35 U.S.C. 154(b) by 158 days.

(21) Appl. No.: 13/313,266

(22) Filed: Dec. 7, 2011

(65) Prior Publication Data

US 2013/0095657 A1    Apr. 18, 2013

(30) Foreign Application Priority Data

Oct. 17, 2011    (CN) .......................... 2011 1 0313586

(51) Int. Cl.
- H01L 21/44    (2006.01)
- H01L 21/311    (2006.01)
- H01L 21/02    (2006.01)
- H01L 21/768    (2006.01)

(52) U.S. Cl.
CPC .... H01L 21/31144 (2013.01); H01L 21/02063 (2013.01); H01L 21/76814 (2013.01)

(58) Field of Classification Search
CPC ................................................ H01L 21/76814
USPC .......................................... 438/675, 704, 627
See application file for complete search history.

(56) References Cited

U.S. PATENT DOCUMENTS

| | | | | |
|---|---|---|---|---|
| 6,174,798 | B1 * | 1/2001 | Hsia et al. | 438/625 |
| 6,797,627 | B1 | 9/2004 | Shih et al. | |
| 6,828,161 | B2 * | 12/2004 | Summerfelt et al. | 438/3 |
| 7,253,097 | B2 * | 8/2007 | Lim et al. | 438/627 |
| 7,256,502 | B2 * | 8/2007 | Chung | 257/774 |
| 7,379,185 | B2 * | 5/2008 | Borden et al. | 356/445 |
| 7,691,206 | B2 * | 4/2010 | Chen | 134/1 |
| 8,105,942 | B2 * | 1/2012 | Choi et al. | 438/645 |
| 8,426,319 | B2 * | 4/2013 | Mistkawi et al. | 438/754 |
| 2003/0087529 | A1 * | 5/2003 | Wu et al. | 438/704 |
| 2004/0198062 | A1 * | 10/2004 | Ye et al. | 438/706 |
| 2005/0170625 | A1 * | 8/2005 | Cong et al. | 438/597 |
| 2007/0125750 | A1 * | 6/2007 | Weng et al. | 216/67 |
| 2007/0190797 | A1 * | 8/2007 | Wu et al. | 438/745 |
| 2009/0131295 | A1 * | 5/2009 | Cui | 510/176 |
| 2010/0055897 | A1 * | 3/2010 | Chou et al. | 438/638 |

(Continued)

FOREIGN PATENT DOCUMENTS

| | | |
|---|---|---|
| CN | 1608311 | 4/2005 |
| CN | 101303966 | 11/2008 |
| JP | 2004133384 | 4/2004 |

OTHER PUBLICATIONS

Office Action from corresponding Chinese Appl. No. 201110313596.3. dated Nov. 18, 2014.

Primary Examiner — Jarrett Stark
Assistant Examiner — Mohammad M Hoque
(74) Attorney, Agent, or Firm — Koppel, Patrick, Heybl & Philpott (57) ABSTRACT

This disclosure relates to a post-etch treating method. An opening is formed by etching a stacked structure of a dielectric layer, an intermediate layer and a metal hard mask layer arranged in order from bottom to top. The treating method sequentially comprises steps of: performing a first cleaning process on the stacked structure with the opening so as to remove at least a part of the metal hard mask layer; and performing a second cleaning process on the stacked structure with the opening so as to remove etching residues.

20 Claims, 4 Drawing Sheets

(56) References Cited

U.S. PATENT DOCUMENTS

| | | |
|---|---|---|
| 2010/0167514 A1* | 7/2010 | Kirkpatrick et al. .......... 438/587 |
| 2010/0190347 A1* | 7/2010 | RamachandraRao et al. ............................ 438/703 |
| 2010/0225003 A1* | 9/2010 | Lagha et al. ................... 257/774 |
| 2011/0139750 A1* | 6/2011 | Lee et al. ........................ 216/67 |
| 2011/0212616 A1* | 9/2011 | Seidel et al. ................... 438/652 |
| 2011/0250751 A1 | 10/2011 | Lee et al. |
| 2012/0248609 A1* | 10/2012 | Tomita .......................... 257/751 |

* cited by examiner

POST-ETCH TREATING METHOD

CROSS-REFERENCE TO RELATED APPLICATIONS

This application claims priority to Chinese Patent Application No. 201110313586.3, filed on Oct. 17, 2011 and entitled "Post-etch Treating Method", which is incorporated herein in its entirety by reference.

BACKGROUND OF THE INVENTION

1. Field of the Invention

This disclosure relates to a field of semiconductor manufacturing, and in particular relates to a treating method to be used after etching by use of a metal hard mask.

2. Description of the Related Art

Figure 1A:
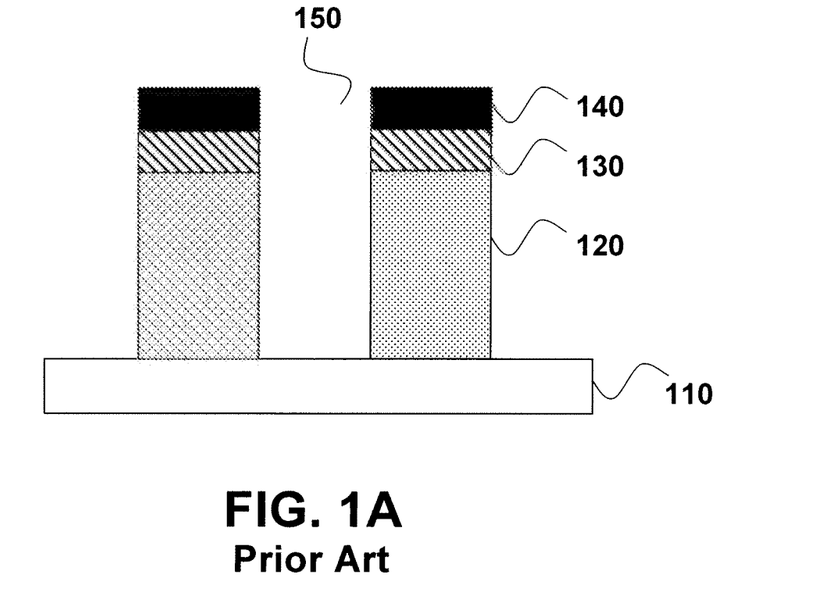
FIG. 1A is a schematic sectional view of a stacked structure with an opening after etching.

In the field of semiconductor manufacturing, an opening is generally formed in a stacked structure by etching. FIG. 1A schematically illustrates a stacked structure with an opening after etching. As illustrated in FIG. 1A, on a semiconductor substrate 110, an opening 150 is formed by etching in a stacked structure of a dielectric layer 120, an intermediate layer 130 and a metal hard mask layer 140 arranged in order from bottom to top. The metal hard mask layer 140 may be used for interconnection technology employing a dielectric material with a low dielectric constant (i.e., low-k), and it may, for example, be formed of titanium nitride (TiN) or the like.

Due to etching, a large amount of etching residues (not shown in FIG. 1A) exist on the sidewalls and bottom of the opening and on the stacked structure, which will deteriorate performances of the semiconductor device. Therefore, after etching a cleaning process is generally performed on the stacked structure with the opening so as to remove the etching residues.

The present inventors have conducted in-depth investigation on post-etch treating methods in the prior art, and have found that the following problems exist.

Figure 1B:
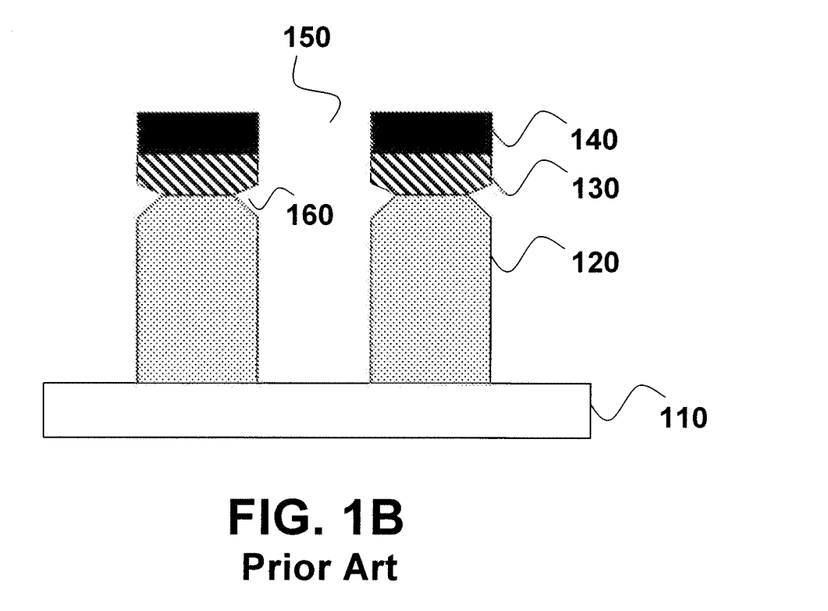
FIG. 1B is a schematic sectional view of the stacked structure with the opening after a prior art cleaning process.

For example, the dielectric layer 120 is generally corroded by the cleaning solution used for removing the etching residues, which is particularly notable when the dielectric layer 120 is formed of a porous material. FIG. 1B schematically illustrates a sectional view of the stacked structure with the opening after the cleaning process. As illustrated in FIG. 1B, as a result of the corrosion by the cleaning solution during the cleaning process used for removing the etching residues, a gap 160 is generated at an interface between the dielectric layer 120 and the intermediate layer 130 on the sidewalls of the opening 150, i.e., a necking phenomenon occurs. Incidentally, since the materials of the intermediate layer 130 and the metal hard mask layer 140 are generally denser than that of the dielectric layer 120, a gap formed at an interface between the intermediate layer 130 and the metal hard mask layer 140 (not shown in FIG. 1B) is generally smaller than that at the interface between the dielectric layer 120 and the intermediate layer 130; moreover, as for the gap 160 at the interface between the dielectric layer 120 and the intermediate layer 130, the part of the gap on the side of the intermediate layer 130 is smaller than the part of the gap on the side of the dielectric layer 120.

In addition, the metal hard mask layer 140 formed of titanium nitride or the like generally causes a high tensile stress, which may further aggravate significantly the necking phenomenon during the cleaning process used for removing the etching residues.

The occurrence of the necking phenomenon will seriously affect the formation of layers (such as a barrier layer and a seed layer) in the opening 150, thereby the process window for subsequent deposition will become smaller, and the contact resistance (Rc) and sheet resistance (Rs) of a metal (such as copper) subsequently filling the opening 150 can not reach target values.

SUMMARY OF THE INVENTION

This disclosure is proposed in view of at least one aspect of the above problems.

One of the objects of this disclosure is to provide a post-etch treating method, which can alleviate the necking phenomenon that occurs during the cleaning process used for removing the etching residues.

According to one aspect of this disclosure, there is provided a post-etch treating method, an opening being formed in a stacked structure of a dielectric layer, an intermediate layer and a metal hard mask layer arranged in order from bottom to top by the etching, the treating method sequentially comprising steps of: performing a first cleaning process on the stacked structure with the opening so as to remove at least a part of the metal hard mask layer; and performing a second cleaning process on the stacked structure with the opening so as to remove etching residues.

Optionally, the treating method further comprises a step of: performing a pre-cleaning process on the stacked structure with the opening before performing the first cleaning process on the stacked structure with the opening.

Optionally, the treating method further comprises a step of sequentially forming a barrier layer and a seed layer on the sidewalls and bottom of the opening and filling the opening with copper after performing the second cleaning process on the stacked structure with the opening.

Optionally, the treating method further comprises a step of performing a sputtering process on a portion of the stacked structure with the opening above the dielectric layer so as to remove corners of the portion at least at the top edge of the opening after performing the second cleaning process on the stacked structure with the opening.

Optionally, the treating method further comprises a step of sequentially forming a barrier layer and a seed layer on the sidewalls and bottom of the opening and filling the opening with copper after performing the sputtering process on the portion of the stacked structure with the opening above the dielectric layer.

Optionally, the first cleaning process is performed by using a hydrogen peroxide ($H_2O_2$) solution.

Optionally, a volume concentration of the hydrogen peroxide solution is 1%~50%.

Optionally, a cleaning time of the hydrogen peroxide solution is 1~10 minutes.

Optionally, the second cleaning process is performed by using a fluorine-containing solution.

Optionally, the fluorine-containing solution is a dilute hydrofluoric acid (DHF) solution, and a volume ratio of deionized water to hydrofluoric acid in the dilute hydrofluoric acid solution is 100:1-500:1.

Optionally, the volume ratio of deionized water to hydrofluoric acid in the dilute hydrofluoric acid solution is 300:1-500:1.

Optionally, the pre-cleaning process is performed by using an EKC solution.

Optionally, the metal hard mask layer is removed by 10%-100%.

Optionally, the dielectric layer is formed of a low-k dielectric material, where k<3.

Optionally, the dielectric layer is formed of Black Diamond (BD).

Optionally, the intermediate layer is formed of a dielectric material.

Optionally, the intermediate layer is formed of tetraethyl orthosilicate (TEOS).

Optionally, the metal hard mask layer is formed of titanium nitride.

Optionally, the opening comprises a trench and/or a via hole.

Optionally, the dielectric layer comprises a plurality of dielectric sublayers.

One of the advantages of the post-etch treating method of this disclosure is that the necking phenomenon that occurs during the cleaning process for removing the etching residues can be alleviated.

BRIEF DESCRIPTION OF THE DRAWINGS

The accompanying drawings, which are incorporated in and constitute a part of the specification, illustrate embodiments of this disclosure and, together with the description, serve to explain the principles of this disclosure.

It is to be noted that, in the accompanying drawings, for convenience of description, the sizes of respective components may not be drawn based on actual scales. Also, the same or similar reference signs represent the same or similar components in the accompanying drawings.

The objects, features and advantages of this disclosure will become apparent from the following detailed description of exemplary embodiments with reference to the accompanying drawings.

DESCRIPTION OF THE EMBODIMENTS

Exemplary embodiments of this disclosure will be described in detail below with reference to the accompanying drawings. It shall be noted that the following description is merely illustrative and exemplary in nature, and is in no way intended to limit this disclosure, its applications or uses. The relative arrangement of components and steps, the numerical expressions and the numerical values set forth in the embodiments do not limit the scope of this disclosure unless it is otherwise specifically stated. In addition, techniques, methods and devices known by persons skilled in the art may not be discussed in detail, but are intended to be a part of the specification where appropriate.

Figure 2:
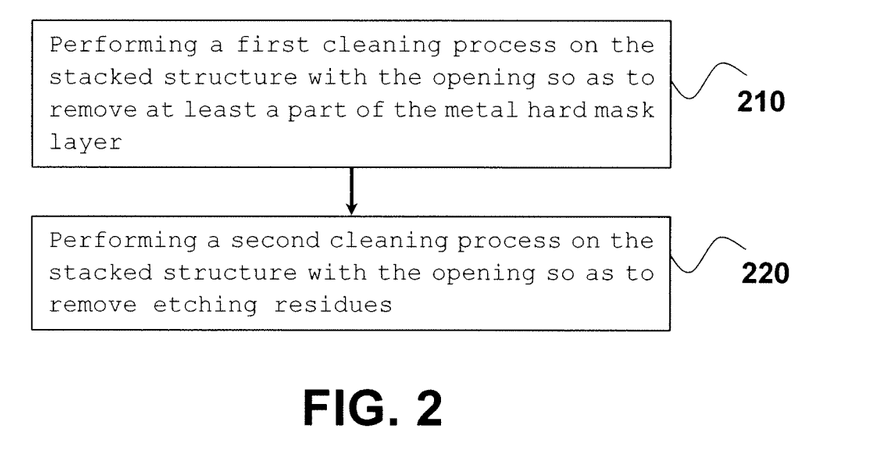
FIG. 2 is a flowchart of a post-etch treating method according to one embodiment of this disclosure.

This disclosure relates to a post-etch treating method, an opening being formed in a stacked structure of a dielectric layer, an intermediate layer and a metal hard mask layer arranged in order from bottom to top by the etching, for example. FIG. 2 is a flowchart of a post-etch treating method according to one embodiment of this disclosure. First, in step 210 of FIG. 2, a first cleaning process is performed on the stacked structure with the opening so as to remove at least a part of the metal hard mask layer. Then, in step 220 of FIG. 2, a second cleaning process is performed on the stacked structure with the opening so as to remove etching residues. According to the post-etch treating method of this disclosure as shown in FIG. 2, since at least a part of the metal hard mask layer is removed before the second cleaning process is performed on the stacked structure with the opening so as to remove the etching residues, the tensile stress caused by the metal hard mask layer during the cleaning process for removing the etching residues is reduced or even eliminated as compared with the prior art, which enables to alleviate the necking phenomenon that occurs during the cleaning process for removing the etching residues. The alleviation of the necking phenomenon will facilitate the formation of layers (such as a barrier layer and a seed layer) in the opening, thereby the process window for subsequent deposition will be increased, and the contact resistance and sheet resistance of a metal (such as copper) subsequently filling in the opening will be decreased etc.

Figure 3:
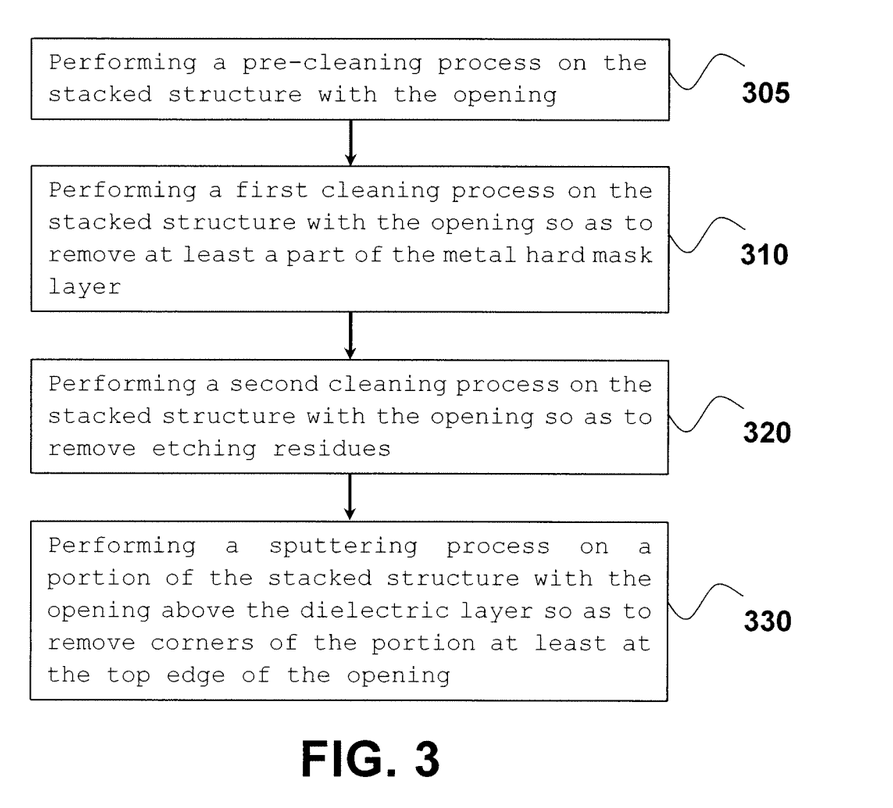
FIG. 3 is a flowchart of a post-etch treating method according to another embodiment of this disclosure.

Another embodiment of this disclosure will be described in more detail below with reference to FIGS. 3 and 4A-4D, wherein FIG. 3 is a flowchart of a post-etch treating method according to the other embodiment of this disclosure, and FIGS. 4A-4D are schematic sectional views illustrating structures obtained after respective steps in the post-etch treating method of FIG. 3.

Figure 4A:
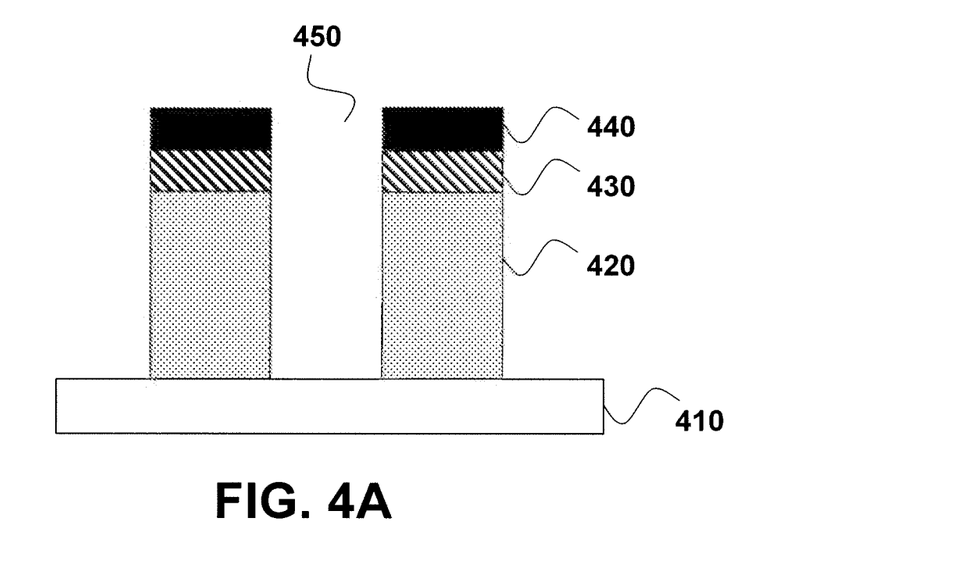
FIG. 4A is a schematic sectional view of the stacked structure with the opening after a pre-cleaning process according to this disclosure.

First, in step 305 of FIG. 3, a pre-cleaning process is performed on a stacked structure with an opening (see FIG. 4A).

Before the pre-cleaning process, on a semiconductor substrate 410, an opening 450 is formed by etching in a stacked structure of a dielectric layer 420, an intermediate layer 430 and a metal hard mask layer 440 arranged in order from bottom to top. Due to etching, a large amount of etching residues exist on the sidewalls and bottom of the opening 450 as well as on the stacked structure (for convenience, the etching residues are not shown in the figures).

The semiconductor substrate 410 may be a substrate of any kind known in the art, and other openings, metal layers and the like may also have been formed therein, for example.

The dielectric layer 420 is not limited particularly in material, and it may, for example, be formed of a low-k dielectric material (k<3). More specifically, the dielectric layer 420 may, for example, be formed of Black Diamond. Black Diamond is a porous low-k dielectric material, and it is liable to be corroded by the cleaning solution used for removing the etching residues causing a necking phenomenon to occur.

The metal hard mask layer 440 may provide good protection to the dielectric layer 420 during the photolithography and etching processes. The metal hard mask layer 440 is not limited particularly in material, and it may, for example, be a metal hard mask layer based on titanium or tantalum. More specifically, the metal hard mask layer 440 may, for example, be formed of titanium nitride. The metal hard mask layer 440 may be applied in a single damascene process or a dual damascene process employing copper/low-k dielectric materials, but is not limited thereto. In addition, as mentioned above, the metal hard mask layer 440 formed of titanium nitride or the like generally causes a high tensile stress, and as a result the necking phenomenon during the cleaning process used for removing the etching residues is aggravated.

The intermediate layer 430 may be formed between the dielectric layer 420 and the metal hard mask layer 440, and it may be used to isolate the dielectric layer 420 from the metal hard mask layer 440, and may also serve as a stop layer for the chemical mechanical polishing (CMP) etc. The intermediate layer 430 is not limited particularly in material, and it may, for example, be formed of a dielectric material. More specifically, the intermediate layer 430 may, for example, be formed of tetraethyl orthosilicate.

The opening 450 may comprise a trench and/or a via hole. For example, the opening 450 may be a trench and a via hole in a dual damascence structure. Moreover, the dual damascence structure may be a structure obtained by forming the via hole first and then forming the trench or a structure obtained by forming the trench first and then forming the via hole.

Incidentally, the dielectric layer 420 may comprise a plurality of dielectric sublayers, and other intermediate layers may also be provided between the plurality of dielectric sublayers.

In step 305 of FIG. 3, the pre-cleaning process is performed on the stacked structure with the opening. The pre-cleaning process at least partially removes the etching residues on the metal hard mask layer 440 so that the metal hard mask layer removal process described below may be performed more effectively. In some examples of this disclosure, the pre-cleaning process may, for example, be performed by using an EKC solution. The EKC solution is a well-known solution for cleaning the etching residues; its main components comprise hydroxylamine (HDA) and the like. Generally speaking, the EKC solution causes little damage the dielectric layer 420. FIG. 4A schematically illustrates a sectional view of the stacked structure with the opening 450 after the pre-cleaning process. Since the etching residues are not shown in FIG. 4A, the sectional views of the stacked structure with the opening before and after the pre-cleaning process are substantially the same.

It is to be noted that the pre-cleaning process may also not be performed in some embodiments of this disclosure.

Figure 4B:
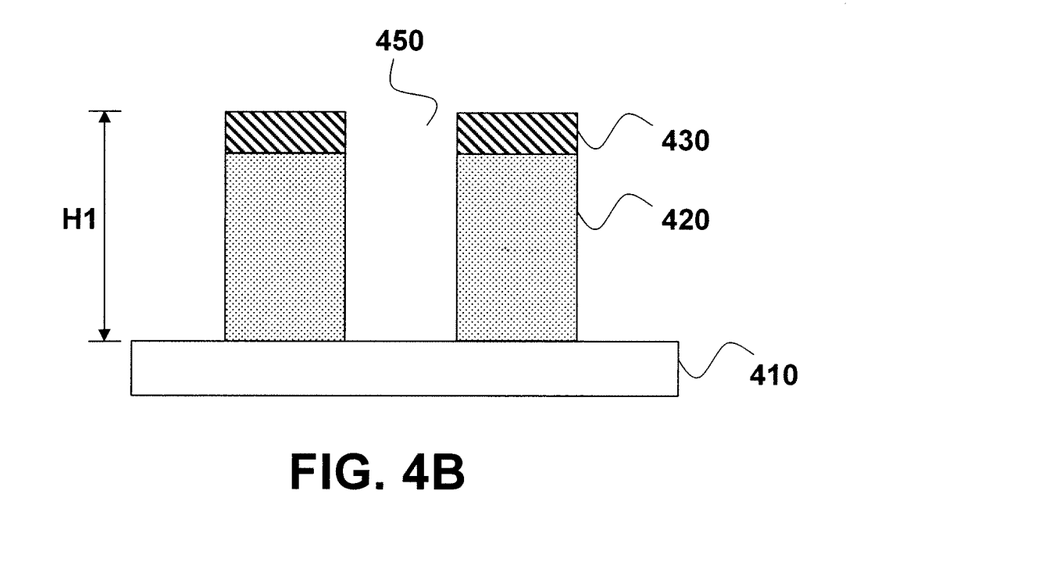
FIG. 4B is a schematic sectional view of the stacked structure with the opening after a first cleaning process according to this disclosure.

Next, in step 310 of FIG. 3, a first cleaning process is performed on the stacked structure with the opening 450 so as to remove at least a part of the metal hard mask layer 440 (see FIG. 4B).

In some examples of this disclosure, for example, the first cleaning process may be performed by using a hydrogen peroxide solution. The proportion of the metal hard mask layer 440 that is removed may be controlled by appropriately selecting the concentration and the cleaning time of the hydrogen peroxide solution. Optionally, the volume concentration of the hydrogen peroxide solution is 1%~50%. Optionally, the cleaning time of the hydrogen peroxide solution is 1~10 minutes. In addition, optionally, 10%~100% of the metal hard mask layer 440 is removed. As an example, FIG. 4B illustrates a sectional view where the metal hard mask layer 440 is completely removed. As illustrated in FIG. 4B, only a stacked structure of the dielectric layer 420 and the intermediate layer 430 arranged in order from bottom to top is left on the semiconductor substrate 410, and an opening 450 is formed therein.

Figure 4C:
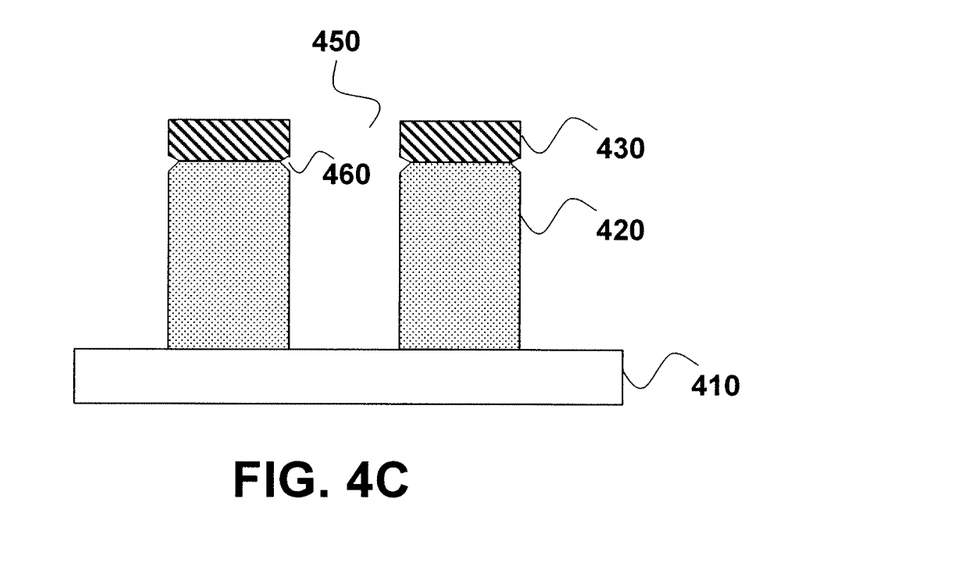
FIG. 4C is a schematic sectional view of the stacked structure with the opening after a second cleaning process according to this disclosure.

In step 320 of FIG. 3, a second cleaning process is performed on the stacked structure with the opening 450 so as to remove the etching residues (see FIG. 4C).

In the field of semiconductor manufacturing, a cleaning process is generally performed after etching so as to remove etching residues, thereby various parameters (such as Kelvin Rc) of a reference hole used for determining process limits can be made to be within design specifications. For example, the second cleaning process may be performed by using a fluorine-containing solution. Optionally, the fluorine-containing solution is a dilute hydrofluoric acid solution. The dilute hydrofluoric acid solution has a strong cleaning capacity; although it generally causes a certain damage to the dielectric layer 420, it can effectively clean etching residues such as post-etch polymers, damaged dielectric materials and the like. According to the result of wafer acceptance test (WAT), in some examples of this disclosure, the volume ratio of deionized water to hydrofluoric acid in the dilute hydrofluoric acid solution may, for example, be 100:1~500:1. In some other examples of this disclosure, the volume ratio of deionized water to hydrofluoric acid in the dilute hydrofluoric acid solution may, for example, be 300:1~500:1.

Since at least a part of the metal hard mask layer 440 is removed before the etching residues are removed, the tensile stress caused by the metal hard mask layer 440 during the cleaning process used for removing the etching residues is reduced or even eliminated, which enables the necking phenomenon that occurs during the cleaning process used for removing the etching residues to be significantly alleviated. In comparison, in the prior art, since the removal of at least a part of the metal hard mask layer 140 is not performed before the etching residues are removed, the tensile stress caused by the metal hard mask layer 140 during the cleaning process used for removing the etching residues significantly aggravates the necking phenomenon. This point is illustrated by the comparison of FIG. 1B and FIG. 4C. More specifically, although a gap 460 is also generated at an interface between the dielectric layer 420 and the intermediate layer 430 on the sidewalls of the opening 450 in FIG. 4C, the gap 460 in FIG. 4C is shown as much smaller than the gap 160 in FIG. 1B. Thus, the post-etch treating method set forth herein can alleviate the necking phenomenon that occurs during the cleaning process for removing the etching residues. This will facilitate the formation of layers (such as a barrier layer and a seed layer) in the opening 450, thereby the process window for subsequent deposition will be increased, and the contact resistance and sheet resistance of a metal (such as copper) filled in the opening subsequently will be decreased etc.

Incidentally, when the pre-cleaning process is performed before the metal hard mask layer removal process, since the pre-cleaning process can at least partially remove the etching residues, the concentration of the cleaning solution may be lower and the cleaning time thereof may also be shorter in the etching residue removal process of this disclosure as compared with the prior art. For example, in the prior art, the volume ratio of deionized water to hydrofluoric acid in the dilute hydrofluoric acid solution is generally less than 100:1; whereas in the process of this disclosure, as described above, the volume ratio of deionized water to hydrofluoric acid in the dilute hydrofluoric acid solution may, for example, be 100:1~500:1, or even 300:1~500:1. Since the concentration of the cleaning solution may be lower and the cleaning time thereof may also be shorter in the etching residue removal process of this disclosure, the alleviation of the necking phenomenon that occurs during the cleaning process for removing the etching residues is further facilitated, i.e., the reduction of the gap 460 in FIG. 4C is further facilitated.

In addition, during the post-etch processes of this disclosure, since at least a part of the metal hard mask layer 440 is removed before the etching residue removal process, the longitudinal length of the opening 450 is reduced, thereby the aspect ratio of the opening 450 becomes smaller. This will further facilitate the formation of layers (such as a barrier layer and a seed layer) in the opening 450 so as to increase the process window for subsequent deposition, and will further facilitate the filling of a metal (such as copper) in the opening 450 and the like. In comparison, during the post-etch processes of the prior art (see FIGS. 1A~1B), since the removal of at least a part of the metal hard mask layer 140 is not performed before the etching residue removal process, the longitudinal length of the opening 150 is not reduced as disclosed herein; thereby, the aspect ratio of the opening 150 does not become smaller as disclosed herein. This will make it difficult to carry out the formation of layers (such as a barrier layer and a seed layer) in the opening 150, the filling of a metal (such as copper) in the opening 150 and the like.

Figure 4D:
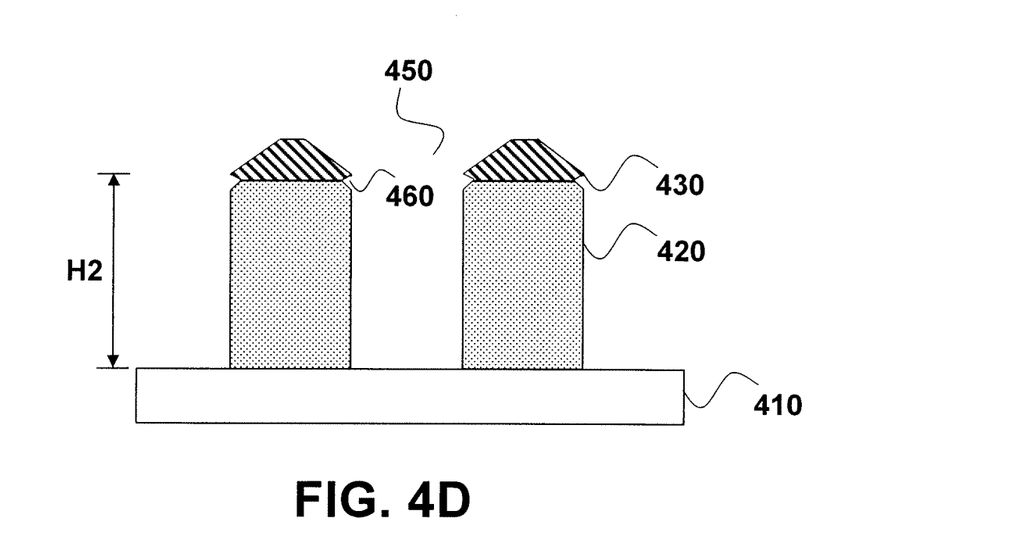
FIG. 4D is a schematic sectional view of the stacked structure with the opening after a sputtering process is performed on a portion above the dielectric layer thereof according to this disclosure.

Next, in step 330 of FIG. 3, after the second cleaning process is performed on the stacked structure with the opening 450, a sputtering process is performed on a portion of the stacked structure with the opening 450 above the dielectric layer 420 so as to remove corners of the portion at least at the top edge of the opening 450 (see FIG. 4D).

In the case the metal hard mask layer 440 is completely removed, corners of the intermediate layer 430 at least at the top edge of the opening 450 can be removed by the sputtering process (as shown in FIG. 4D). On the other hand, if the metal hard mask layer 440 is not removed completely, the corners at least at the top edge of the opening 450 removed by the sputtering process may only comprise the metal hard mask layer 440, or may comprise both the metal hard mask layer 440 and the intermediate layer 430. In either case, the longitudinal length of the opening 450 will be further reduced as long as the corners are removed by the sputtering process. It is assumed that the longitudinal length of the opening 450 is H1 after the metal hard mask layer removal process (see FIG. 4B) and is H2 after the sputtering process (see FIG. 4D), then H2<H1. Since the longitudinal length of the opening 450 is further reduced, the aspect ratio of the opening 450 becomes even smaller. This will still further facilitate the formation of layers (such as a barrier layer and a seed layer) in the opening 450 so as to increase the process window for subsequent deposition, and will still further facilitate the filling of a metal (such as copper) in the opening 450 and the like.

Optionally, after the sputtering process is performed on the portion of the stacked structure with the opening 450 above the dielectric layer 420, a barrier layer and a seed layer are sequentially formed on the sidewalls and bottom of the opening 450, and the opening 450 is filled with a metal (such as copper).

It is to be noted that the sputtering process may also not be performed in some embodiments of this disclosure. In such a case, optionally, after the second cleaning process is performed on the stacked structure with the opening (see FIG. 4C), a barrier layer and a seed layer are sequentially formed on the sidewalls and bottom of the opening 450, and the opening 450 is filled with a metal (such as copper).

According to the above teaching, it is readily apparent to persons skilled in the art that the post-etch treating method of this disclosure can achieve technical effects such as alleviating the necking phenomenon that occurs during the cleaning process for removing the etching residues and the like.

Up to now, the post-etch treating method according to this disclosure has been described in detail. Some details well known in the art are not described in order to avoid obscuring the concept of this disclosure. Persons skilled in the art can thoroughly understand how to implement the technical solutions disclosed herein according to the above description.

While this disclosure has been described with reference to exemplary embodiments, it shall be understood that this disclosure is not limited to the disclosed exemplary embodiments. It is obvious to persons skilled in the art that the above exemplary embodiments may be modified without deviating from the scope and spirit of this disclosure. The scope of the appended claims shall be accorded with the broadest interpretation so as to encompass all such modifications and equivalent structures and functions.

What is claimed is:

1. A post-etch treating method for alleviating a necking phenomenon, an opening being formed in a stacked structure of a dielectric layer, an intermediate layer and a metal hard mask layer arranged in order from bottom to top by the etching, the necking phenomenon occurring between the dielectric layer and the intermediate layer, the treating method sequentially comprising steps of:
    performing a first cleaning process on the stacked structure with the opening so as to remove at least a part of the metal hard mask layer; and
    immediately after the first cleaning process, performing a second cleaning process on the stacked structure with the opening so as to remove etching residues,
    wherein the intermediate layer is used to serve as a stop layer for a chemical mechanical polishing,
    wherein the opening extends from the metal hard mask layer to the dielectric layer.

2. The post-etch treating method of claim 1, further comprising a step of:
    performing a pre-cleaning process on the stacked structure with the opening before performing the first cleaning process on the stacked structure with the opening.

3. The post-etch treating method of claim 1, further comprising a step of:
    sequentially forming a barrier layer and a seed layer on the sidewalls and bottom of the opening and filling the opening with copper after performing the second cleaning process on the stacked structure with the opening.

4. The post-etch treating method of claim 1, further comprising a step of:
    performing a sputtering process on a portion of the stacked structure with the opening above the dielectric layer so as to remove corners of the portion at least at the top edge of the opening after performing the second cleaning process on the stacked structure with the opening.

5. The post-etch treating method of claim 4, further comprising a step of:
    sequentially forming a barrier layer and a seed layer on the sidewalls and bottom of the opening and filling the opening with copper after performing the sputtering process on the portion of the stacked structure with the opening above the dielectric layer.

6. The post-etch treating method of claim 1, wherein the first cleaning process is performed by using a hydrogen peroxide solution.

7. The post-etch treating method of claim 6, wherein a volume concentration of the hydrogen peroxide solution is 1%~50%.

8. The post-etch treating method of claim 7, wherein a cleaning time of the hydrogen peroxide solution is 1~10 minutes.

9. The post-etch treating method of claim 1, wherein the second cleaning process is performed by using a fluorine-containing solution.

10. The post-etch treating method of claim 9, wherein the fluorine-containing solution is a dilute hydrofluoric acid solution, and a volume ratio of deionized water to hydrofluoric acid in the dilute hydrofluoric acid solution is 100:1~500:1.

11. The post-etch treating method of claim 10, wherein the volume ratio of deionized water to hydrofluoric acid in the dilute hydrofluoric acid solution is 300:1~500:1.

12. The post-etch treating method of claim 2, wherein the pre-cleaning process is performed by using an EKC solution.

13. The post-etch treating method of claim 1, wherein 10%-100% of the metal hard mask layer is removed.

14. The post-etch treating method of claim 1, wherein the dielectric layer is formed of a low-k dielectric material, where k<3.

15. The post-etch treating method of claim 14, wherein the dielectric layer is formed of a porous low-k dielectric material.

16. The post-etch treating method of claim 1, wherein the intermediate layer is formed of a dielectric material.

17. The post-etch treating method of claim 16, wherein the intermediate layer is formed of tetraethyl orthosilicate.

18. The post-etch treating method of claim 1, wherein the metal hard mask layer is formed of titanium nitride.

19. The post-etch treating method of claim 1, wherein the opening comprises a trench, a via hole, or both a trench and a via hole.

20. The post-etch treating method of claim 1, wherein the dielectric layer comprises a plurality of dielectric sublayers.

* * * * *